US007012118B2

(12) United States Patent
Hansen et al.

(10) Patent No.: US 7,012,118 B2
(45) Date of Patent: *Mar. 14, 2006

(54) PHOTOPOLYMERIZABLE COMPOSITIONS AND FLEXOGRAPHIC PLATES PREPARED FROM CONTROLLED DISTRIBUTION BLOCK COPOLYMERS

(75) Inventors: David Romme Hansen, Houston, TX (US); David John St. Clair, Houston, TX (US); Donn Anthony Dubois, Houston, TX (US); Dale Lee Handlin, Jr., Houston, TX (US); Carl Lesley Willis, Houston, TX (US)

(73) Assignee: KRATON Polymers U.S. LLC, Houston, TX (US)

( * ) Notice: Subject to any disclaimer, the term of this patent is extended or adjusted under 35 U.S.C. 154(b) by 81 days.

This patent is subject to a terminal disclaimer.

(21) Appl. No.: 10/681,608

(22) Filed: Oct. 8, 2003

(65) Prior Publication Data

US 2004/0072951 A1    Apr. 15, 2004

Related U.S. Application Data

(63) Continuation-in-part of application No. 10/359,981, filed on Feb. 6, 2003.

(60) Provisional application No. 60/355,210, filed on Feb. 7, 2002.

(51) Int. Cl.
   C08F 297/04    (2006.01)

(52) U.S. Cl. .................. 525/88; 525/89; 525/316; 525/380; 525/338; 525/258

(58) Field of Classification Search ............... 525/88, 525/89, 316, 280, 338, 258
See application file for complete search history.

(56) References Cited

U.S. PATENT DOCUMENTS

| 3,239,478 A | 3/1966 | Harlan |
|---|---|---|
| 3,281,383 A | 10/1966 | Zelinski et al. |
| 3,494,942 A | 2/1970 | Miki et al. |
| RE27,145 E | 6/1971 | Jones |
| 3,634,549 A | 1/1972 | Shaw et al. |
| 3,670,054 A | 6/1972 | De La Mare et al. |
| 3,700,633 A | 10/1972 | Wald et al. |
| 4,126,466 A | 11/1978 | Roos |
| 4,266,005 A | 5/1981 | Nakamura et al. |
| 4,320,188 A | 3/1982 | Heinz et al. |
| 4,430,417 A | 2/1984 | Heinz et al. |
| 4,460,675 A | 7/1984 | Gruetzmacher et al. |
| 5,191,024 A * | 3/1993 | Shibata et al. .............. 525/314 |
| 5,213,948 A | 5/1993 | Abele |
| 6,531,263 B1 | 3/2003 | Knoll |
| 6,759,454 B1 * | 7/2004 | Stephens et al. .............. 524/68 |

FOREIGN PATENT DOCUMENTS

| DE | 22 15 090 | 9/1974 |
|---|---|---|
| DE | 36 30 474 | 7/1990 |
| DE | 37 44 243 | 12/1995 |
| EP | 0 796 871 | 9/1997 |
| EP | 0 822 227 | 2/1998 |
| EP | 0 878 492 | 11/1998 |
| EP | 0 879 836 | 11/1998 |
| EP | 0 984 038 A1 | 3/2000 |
| EP | 1 158 364 A2 | 11/2001 |

OTHER PUBLICATIONS

Yih-Chau Lin et al: "Using Heavy Ethers as Structire Modifiers in the Synthesis of SBS Block Copolymers in Cyclohexane" Journal of Applied Polymer Science, John Wiley and Sons, Inc. New York, US, vol. 64 No. 13, Jun. 27, 1997, pp. 2543-2560.

* cited by examiner

*Primary Examiner*—James J. Seidleck
*Assistant Examiner*—Olga Asinovsky
(74) *Attorney, Agent, or Firm*—Dean F. Vance; Michael A. Masse

(57) ABSTRACT

The present invention relates to a photopolymerizable composition, which comprises:
   (a) a block copolymer component comprising an unhydrogenated styrene diene block copolymer and a hydrogenated controlled distribution styrene diene block copolymer
   (b) one or more photopolymerizable ethylenically unsaturated low molecular weight compounds,
   (c) one or more polymerization initiators, and optionally
   (d) from 0 to 40% by weight, based on the total photopolymerizable compositions, of one or more auxiliaries.

The invention also includes flexographic printing plates derived from said photopolymerizable compositions, and flexographic printing relief forms prepared from said plates.

20 Claims, No Drawings

PHOTOPOLYMERIZABLE COMPOSITIONS AND FLEXOGRAPHIC PLATES PREPARED FROM CONTROLLED DISTRIBUTION BLOCK COPOLYMERS

CROSS-REFERENCE TO RELATED APPLICATIONS

The present application claims priority from copending, commonly assigned U.S. patent applications Ser. No. 60/355,210, filed Feb. 7, 2002, entitled Novel Block Copolymers and Method for Making Same, and Continuation-in-part (CIP) of prior application Ser. No.: 10/359,981 filed Feb. 6, 2003, pending.

BACKGROUND OF THE INVENTION

1. Field of the Invention

The present invention relates to photopolymerizable compositions, to flexographic printing plates derived from said compositions and to flexographic printing relief forms prepared from said plates. More in particular, the present invention relates to compositions showing an improved combination of processing stability, transparency and ozone resistance.

2. Description of the Related Art

Photopolymerizable printing plates are known for use in making flexographic printing forms. The printing surface is produced by exposing a photopolymerizable layer imagewise to actinic radiation and subsequently removing the unexposed, non-photopolymerized areas of the printing plate. Examples are found in the following patents: DE C-2215090, U.S. Pat. Nos. 4,266,005, 4,320,188, 4,126,466, 4,430,417, 4,460,675 and 5,213,948.

Such photopolymerizable printing plates usually comprise a support, an optional adhesive layer or other underlayer, one or more photopolymerizable layers, an optional elastomeric intermediate layer and a cover layer. A preferred method for making such multilayer photopolymerizable printing plates is by a process in which a previously extruded photopolymerizable composition is fed into the nip of a calendar and is calendered between a support layer and a cover layer, thus forming a photopolymerizable layer between them. EP B-0084851 disclosed a preparation method for a multilayer photopolymerizable printing plate, having an added elastomeric layer between the cover layer and the photopolymerizable layer.

The photopolymerizable layers contain polymeric binders, photopolymerizable monomers, photo-initiators, and added auxiliaries such as plasticizers, fillers, stabilizers etc. The polymeric binders are usually thermoplastic elastomeric block copolymers, as disclosed in e.g. U.S. Pat. No. 6,531,263 and DE-C-2,215,090. These are generally block copolymers of the general formulae A-B-A or $(AB)_n$ or $(AB)_nX$, comprising thermoplastic blocks A and elastomeric blocks B, particularly linear and radial block copolymers with poly(monovinyl aromatic hydrocarbon) end blocks.

Unhydrogenated styrene diene block copolymers, both the SIS and SBS types, can be used to make UV cured, flexographic printing plates. Although they are widely used and give excellent performance, one limitation is that the plates made with the unsaturated polymers have limited resistance to degradation by ozone. This is becoming more of a problem as UV cured inks become more widely used since ozone is generated from oxygen during the UV irradiation used to cure the ink. It would be highly desirable to make the plates using a blend of the unhydrogenated block polymer with at least a small amount of a hydrogenated block copolymer. The hydrogenated block polymer would probably not co-cure into the plate but it may improve the resistance to degradation by ozone. The problem is that hydrogenated block copolymers are typically thermodynamically incompatible with unhydrogenated block copolymers, and so blends are hazy or may even phase separate. The presence of haze in the plate would interfere with cure of the plate by scattering the UV light.

Now a novel anionic block copolymer based on mono alkenyl arene end blocks and controlled distribution mid blocks of mono alkenyl arenes and conjugated dienes has been discovered and is described in copending, commonly assigned U.S. patent application Ser. No. 60/355,210, entitled "NOVEL BLOCK COPOLYMERS AND METHOD FOR MAKING SAME". Methods for making such polymers are described in detail in the above-mentioned patent application. Patentees have found that phase stable, clear compositions can be made using blends of unsaturated styrene/diene block copolymers, including both SIS and SBS copolymers, with these new polymers. This allows formulators to develop flexographic plates which have the good performance found for unhydrogenated block copolymers along with better resistance to degradation by ozone.

SUMMARY OF THE INVENTION

Accordingly the present invention relates to a photopolymerizable composition, which comprises:
(a) a block copolymer component comprising a non-hydrogenated styrene diene block copolymer and a hydrogenated, controlled-distribution block copolymer, wherein said hydrogenated, controlled-distribution block copolymer has at least one polymer block A and at least one polymer block B, and wherein:
  i) prior to hydrogenation each A block is a mono alkenyl arene homopolymer block and each B block is a controlled distribution copolymer block of at least one conjugated diene and at least one mono alkenyl arene;
  ii) subsequent to hydrogenation about 0–10% of the arene double bonds have been reduced, and at least about 90% of the conjugated diene double bonds have been reduced;
  iii) each A block having a number average molecular weight between about 3,000 and about 60,000 and each B block having a number average molecular weight between about 20,000 and about 300,000;
  iv) each B block comprises terminal regions adjacent to the A blocks that are rich in conjugated diene units and one or more regions not adjacent to the A blocks that are rich in mono alkenyl arene units;
  v) the total amount of mono alkenyl arene in the hydrogenated block copolymer is about 20 percent weight to about 80 percent weight; and
  vi) the weight percent of mono alkenyl arene in each B block is between about 10 percent and about 75 percent;
(b) one or more photopolymerizable ethylenically unsaturated low molecular weight compounds,
(c) one or more polymerization initiators, and optionally
(d) from 0 to 40% by weight, based on the total photopolymerizable compositions, of one or more auxiliaries.

In a preferred embodiment the block copolymer component comprises a major amount of a linear or radial, styrene/ isoprene or styrene/butadiene block copolymer and a minor amount of the hydrogenated, controlled distribution block copolymer.

The present invention also relates to improved flexographic printing plates derived from said photopolymerizable compositions and to flexographic printing relief forms produced therefrom.

Patentees have found that contrary to prior understandings, it is now possible to make fairly clear, phase-stable blends using selected styrene/diene block copolymers with the novel hydrogenated, controlled distribution styrene/diene block copolymers of the present invention, especially in the presence of an acrylic monomer, such as hexane diol diacrylate. Accordingly, it will now be possible to make UV cured, flexographic printing plates using these blends.

DETAILED DESCRIPTION OF THE PREFERRED EMBODIMENTS

The key component of the present invention is the novel hydrogenated, controlled distribution block copolymer containing mono alkenyl arene end blocks and a unique mid block of a mono alkenyl arene and a conjugated diene. Surprisingly, the combination of (1) a unique control for the monomer addition and (2) the use of diethyl ether or other modifiers as a component of the solvent (which will be referred to as "distribution agents") results in a certain characteristic distribution of the two monomers (herein termed a "controlled distribution" polymerization, i.e., a polymerization resulting in a "controlled distribution" structure), and also results in the presence of certain mono alkenyl arene rich regions and certain conjugated diene rich regions in the polymer block. For purposes hereof, "controlled distribution" is defined as referring to a molecular structure having the following attributes: (1) terminal regions adjacent to the mono alkenyl arene homopolymer ("A") blocks that are rich in (i.e., having a greater than average amount of) conjugated diene units; (2) one or more regions not adjacent to the A blocks that are rich in (i.e., having a greater than average number of) mono alkenyl arene units; and (3) an overall structure having relatively low blockiness. For the purposes hereof, "rich in" is defined as greater than the average amount, preferably greater than 5% of the average amount. This relatively low blockiness can be shown by either the presence of only a single glass transition temperature (Tg) intermediate between the Tg's of either monomer alone, when analyzed using differential scanning calorimetry ("DSC") thermal methods or via mechanical methods, or as shown via proton nuclear magnetic resonance ("H-1 NMR") methods. The potential for blockiness can also be inferred from measurement of the UV-visible absorbance in a wavelength range suitable for the detection of polystyryllithium end groups during the polymerization of the B block. A sharp and substantial increase in this value is indicative of a substantial increase in polystyryllithium chain ends. In this process, this will only occur if the conjugated diene concentration drops below the critical level to maintain controlled distribution polymerization. Any styrene monomer that is present at this point will add in a blocky fashion. The term "styrene blockiness", as measured by those skilled in the art using proton NMR, is defined to be the proportion of S units in the polymer having two S nearest neighbors on the polymer chain. The styrene blockiness is determined after using H-1 NMR to measure two experimental quantities as follows:

First, the total number of styrene units (i.e. arbitrary instrument units which cancel out when ratioed) is determined by integrating the total styrene aromatic signal in the H-1 NMR spectrum from 7.5 to 6.2 ppm and dividing this quantity by 5 to account for the 5 aromatic hydrogens on each styrene aromatic ring.

Second, the blocky styrene units are determined by integrating that portion of the aromatic signal in the H-1 NMR spectrum from the signal minimum between 6.88 and 6.80 to 6.2 ppm and dividing this quantity by 2 to account for the 2 ortho hydrogens on each blocky styrene aromatic ring. The assignment of this signal to the two ortho hydrogens on the rings of those styrene units which have two styrene nearest neighbors was reported in F. A. Bovey, *High Resolution NMR of Macromolecules* (Academic Press, New York and London, 1972), chapter 6.

The styrene blockiness is simply the percentage of blocky styrene to total styrene units:

Blocky %=100 times (Blocky Styrene Units/Total Styrene Units)

Expressed thus, Polymer-Bd-S-(S)n-S-Bd-Polymer, where n is greater than zero is defined to be blocky styrene. For example, if n equals 8 in the example above, then the blockiness index would be 80%. It is preferred that the blockiness index be less than about 40. For some polymers, having styrene contents of ten weight percent to forty weight percent, it is preferred that the blockiness index be less than about 10.

This controlled distribution structure is very important in managing the strength and Tg of the resulting copolymer, because the controlled distribution structure ensures that there is virtually no phase separation of the two monomers, i.e., in contrast with block copolymers in which the monomers actually remain as separate "microphases", with distinct Tg's, but are actually chemically bonded together. This controlled distribution structure assures that only one Tg is present and that, therefore, the thermal performance of the resulting copolymer is predictable and, in fact, predeterminable. Furthermore, when a copolymer having such a controlled distribution structure is then used as one block in a di-block, tri-block or multi-block copolymer, the relatively higher Tg made possible by means of the presence of an appropriately-constituted controlled distribution copolymer region will tend to improve flow and processability. Modification of certain other properties is also achievable.

In a preferred embodiment of the present invention, the subject controlled distribution copolymer block has two distinct types of regions—conjugated diene rich regions on the ends of the block and a mono alkenyl arene rich region near the middle or center of the block. What is desired is a mono alkenyl arene/conjugated diene controlled distribution copolymer block, wherein the proportion of mono alkenyl arene units increases gradually to a maximum near the middle or center of the block and then decreases gradually until the polymer block is fully polymerized. This structure is distinct and different from the tapered and/or random structures discussed in the prior art.

Starting materials for preparing the novel controlled distribution copolymers of the present invention include the initial monomers. The alkenyl arene can be selected from styrene, alpha-methylstyrene, para-methylstyrene, vinyl toluene, vinylnaphthalene, and para-butyl styrene or mixtures thereof. Of these, styrene is most preferred and is commercially available, and relatively inexpensive, from a variety of manufacturers. The conjugated dienes for use herein are 1,3-butadiene and substituted butadienes such as isoprene, piperylene, 2,3-dimethyl-1,3-butadiene, and 1-phenyl-1,3-butadiene, or mixtures thereof. Of these, 1,3-butadiene is most preferred. As used herein, and in the claims, "butadiene" refers specifically to "1,3-butadiene".

As discussed above, the controlled distribution polymer block has diene rich region(s) adjacent to the A block and an arene rich region not adjacent to the A block, and typically near the center of the B block. Typically the region adjacent to the A block comprises the first 15 to 25% of the block and comprises the diene rich region(s), with the remainder considered to be arene rich. The term "diene rich" means that the region has a measurably higher ratio of diene to arene than the arene rich region. Another way to express this is the proportion of mono alkenyl arene units increases gradually along the polymer chain to a maximum near the middle or center of the block (if we are describing an ABA structure) and then decreases gradually until the polymer block is fully polymerized. For the controlled distribution block B the weight percent of mono alkenyl arene is between about 10 percent and about 75.

As used herein, "thermoplastic block copolymer" is defined as a block copolymer having at least a first block of a mono alkenyl arene, such as styrene and a second block of a controlled distribution copolymer of diene and mono alkenyl arene. The method to prepare this thermoplastic block copolymer is via any of the methods generally known for block polymerizations. The present invention includes as an embodiment a thermoplastic copolymer composition, which may be either a di-block, tri-block copolymer or multi-block composition. In the case of the di-block copolymer composition, one block is the alkenyl arene-based homopolymer block and polymerized therewith is a second block of a controlled distribution copolymer of diene and alkenyl arene. In the case of the tri-block composition, it comprises, as end-blocks the glassy alkenyl arene-based homopolymer and as a mid-block the controlled distribution copolymer of diene and alkenyl arene. Where a tri-block copolymer composition is prepared, the controlled distribution diene/alkenyl arene copolymer can be herein designated as "B" and the alkenyl arene-based homopolymer designated as "A". The A-B-A, tri-block compositions can be made by either sequential polymerization or coupling. In the sequential solution polymerization technique, the mono alkenyl arene is first introduced to produce the relatively hard aromatic block, followed by introduction of the controlled distribution diene/alkenyl arene mixture to form the mid block, and then followed by introduction of the mono alkenyl arene to form the terminal block. In addition to the linear, A-B-A configuration, the blocks can be structured to form a radial (branched) polymer, $(A-B)_nX$, or both types of structures can be combined in a mixture.

Some A-B diblock polymer can be present but preferably at least about 30 weight percent of the block copolymer is A-B-A or radial (or otherwise branched so as to have 2 or more terminal resinous blocks per molecule) so as to impart strength.

It is also important to control the molecular weight of the various blocks. For an AB diblock, desired block weights are 3,000 to about 60,000 for the mono alkenyl arene A block, and 30,000 to about 300,000 for the controlled distribution conjugated diene/mono alkenyl arene B block. Preferred ranges are 5000 to 45,000 for the A block and 50,000 to about 250,000 for the B block. For the triblock, which maybe a sequential ABA or coupled $(AB)_2 X$ block copolymer, the A blocks should be 3,000 to about 60,000, preferably 5000 to about 45,000, while the B block for the sequential block should be about 30,000 to about 300,000, and the B blocks (two) for the coupled polymer half that amount. The total average molecular weight for the triblock copolymer should be from about 40,000 to about 400,000, and for the radial copolymer from about 60,000 to about 600,000. These molecular weights are most accurately determined by light scattering measurements, and are expressed as number average molecular weights.

Another important aspect of the present invention is to control the microstructure or vinyl content of the conjugated diene in the controlled distribution copolymer block. The term "vinyl content" refers to a conjugated diene, which is polymerized via 1,2-addition (in the case of butadiene—it would be 3,4-addition in the case of isoprene). Although a pure "vinyl" group is formed only in the case of 1,2-addition polymerization of 1,3-butadiene, the effects of 3,4-addition polymerization of isoprene (and similar addition for other conjugated dienes) on the final properties of the block copolymer will be similar. The term "vinyl" refers to the presence of a pendant vinyl group on the polymer chain. When referring to the use of butadiene as the conjugated diene, it is preferred that about 20 to about 80 mol percent of the condensed butadiene units in the copolymer block have 1,2 vinyl configuration as determined by H-1 NMR analysis, preferably about 30 to about 70 mol percent of the condensed butadiene units should have 1,2-vinyl configuration. This is effectively controlled by varying the relative amount of the distribution agent. As will be appreciated, the distribution agent serves two purposes—it creates the controlled distribution of the mono alkenyl arene and conjugated diene, and also controls the microstructure of the conjugated diene. Suitable ratios of distribution agent to lithium are disclosed and taught in U.S. Pat. No. Re 27,145, which disclosure is incorporated by reference. An important feature of the thermoplastic elastomeric di-block and tri-block polymers of the present invention, including one or more controlled distribution diene/alkenyl arene copolymer blocks and one or more mono alkenyl arene blocks, is that they have at least two Tg's, the lower being the combined Tg of the controlled distribution copolymer block which is an intermediate of its constituent monomers' Tg's. Such Tg is preferably at least about −60 degrees C., more preferably from about −40 degrees C. to about +30 degrees C., and most preferably from about −40 degrees C. to about +10 degrees C. The second Tg, that of the mono alkenyl arene "glassy" block, is preferably more than about 80 degrees C., more preferably from about +80 degrees C. to about +110 degrees C. The presence of the two Tg's, illustrative of the microphase separation of the blocks, contributes to the notable elasticity and strength of the material in a wide variety of applications, and its ease of processing and desirable melt-flow characteristics.

The controlled distribution block copolymer is selectively hydrogenated. Hydrogenation can be carried out via any of the several hydrogenation or selective hydrogenation processes known in the prior art. For example, such hydrogenation has been accomplished using methods such as those taught in, for example, U.S. Pat. Nos. 3,494,942; 3,634,549; 3,670,054; 3,700,633; and Re. 27,145. Hydrogenation can be carried out under such conditions that at least about 90 percent of the conjugated diene double bonds have been reduced, and between zero and 10 percent of the arene double bonds have been reduced. Preferred ranges are at least about 95 percent of the conjugated diene double bonds reduced, and more preferably about 98 percent of the conjugated diene double bonds are reduced. Alternatively, it is possible to hydrogenate the polymer such that aromatic unsaturation is also reduced beyond the 10 percent level mentioned above. In that case, the double bonds of both the conjugated diene and arene may be reduced by 90 percent or more.

The non-hydrogenated styrene diene block copolymers which form the majority of the block copolymer component are the conventional styrene isoprene and styrene butadiene block copolymers, such as those disclosed in U.S. Pat. Nos. 6,531,263, 3,281,383 and 3,239,478, and are available from KRATON Polymers under the trademark KRATON® D polymers. These include linear and radial polymers having structures such as CDC, $(C-D)_n$, $(C-D)_nC$, $(C-D)_nY(D)_m$ or $(C-D)_nY$, where n is an integer from 2 to about 30, m is an integer from 1 to about 5, Y is a coupling agent residue, C is a styrene homopolymer block, and D is a polymer block of one or more conjugated dienes selected from butadiene and isoprene, said unhydrogenated block copolymer having a total molecular weight of about 40,000 to about 250,000 and a styrene content of about 10 percent weight to about 40 percent weight. The diene portion of the polymers will typically have a vinyl content of about 10 mol percent to about 55 mol percent. These polymers are produced according to the usual methods disclosed in U.S. Pat. Nos. 3,239,478 and 3,281,383, which are herein incorporated by reference.

Preferred unhydrogenated block copolymers include SIS, SBS, SB radial polymers, SI radial polymers, and asymmetric polymers such as $(SB)_2Y(B)_{1.5}$. The weight ratio of hydrogenated, controlled distribution block copolymer to unhydrogenated block copolymer is about 5:95 to about 40:60, preferably about 10:90 to about 25:75.

The photopolymerizable compositions to be used according to the present invention comprise as component (b) addition polymerizable ethylenically unsaturated compounds selected from monounsaturated or polyunsaturated monomers, such as e.g. esters or amides of acrylic acid or methacrylic acid with monofunctional or polyfunctional alcohols, amines, aminoalcohols and hydroxyethers or hydroxyesters. Also suitable are mixtures of monounsaturated and polyunsaturated compounds, as described in DE-C 3744243 and DEA-3630474. More specific examples of addition polymerizable compounds are butyl acrylate; isodecyl acrylate; 1,6-hexanediol dimethacrylate; 1,6-hexanediol diacrylate; trimethylolpropane triacrylate and dipentaerythritol monohydroxypentacrylate. Preferred weight proportions of component (b) are in the range from 2 to 50% by weight, relative to weight of components (a) and (b). More preferred weight proportions of component (b) are in the range of from 5 to 30% by weight, relative to the weight of components (a) and (b).

The photopolymerizable compositions also comprise one of the known photoinitiators or photoinitiator systems, as components (c), e.g. methylbenzoin, benzoin acetate, benzophenone, benzil dimethyl-ketal or ethyl anthraquinone/4,4-bis(dimethyl amino)benzophenone. The amount of photoinitiator is generally less than 10% by weight. More preferred weight proportions of component (c) are in the range of from 0.5 to 5% by weight, relative to the weight of the total copolymerizable composition.

Examples of auxiliaries mentioned as component (d) include plasticizers, aromatic resin, additional compatible rubber, fillers, dyes and/or pigments, antioxidants, antiozonants, thermal polymerization inhibitors and liquid poly (isoprene), liquid poly(butadiene) and/or liquid S-B or S-I diblock copolymers.

It will be appreciated that the flexographic printing plates according to the present invention can additionally comprise a support layer, which may consist of sheets of various film-forming synthetic polymers. Polyester and polyester/polyamide sheets, optionally having an adhesive layer and/or antihalation layer, are preferred, and in particular poly-ethylene terephthalate sheets. Moreover said flexographic printing plates may also comprise a cover element, which is usually composed of a flexible cover film, optionally a flexible polymeric film and/or a layer of elastomeric composition. The flexible cover film has to be removed before irradiation. This removal can be facilitated by a fine sheet of release agent between the flexible cover film and the flexible layer of polymeric film and/or a layer of elastomeric composition. If present, this elastomeric layer comprises at least one block copolymer as specified hereinbefore.

The photopolymerizable compositions to be used according to the present invention can be prepared in a conventional manner by homogeneously mixing the individual components, for example in solution, or in a kneader, a mixer or an extruder. Said compositions have good processability and layers of the desired thickness can be produced from the composition by e.g. casting a solution in a suitable solvent, such as toluene, xylene, cyclohexane, cyclopentane, tetrahydrofuran, methyl isobutyl ketone or tetrachloro ethylene, on an appropriate base. Layers of the composition can also be produced by compression molding, extrusion or calendaring, and when a suitable process temperature, combined with a suitable inhibitor is used, no incipient thermal cross-linking will occur. The thickness of the layers can be varied within wide limits and can easily be chosen to suit a particular application. The thickness of the layers is usually in the range of from 0.01 to 6.5 mm.

The flexographic printing plate is exposed image-wise through a negative by commonly used methods. The cover layer of the flexographic printing plate is removed as usual before image-wise exposure. Any type and source of actinic radiation can be used to prepare the flexographic printing relief forms. Suitable radiation sources are, for example, mercury vapour lamps, incandescent lamps with special phosphors that emit ultraviolet light, argon incandescent lamps and photo lamps. The most suitable among these are mercury vapour lamps, particularly ultraviolet light lamps, and ultraviolet fluorescent lamps.

An overall backside exposure can be made before or after image-wise exposure. This exposure can be diffuse or directional. The exposure source can be all of the radiation sources conventionally used for the image-wise exposure.

Unphotopolymerized areas of the printing plate can be washed off with suitable developer solutions, such as, for example, aliphatic or aromatic hydrocarbons such as n-hexane, petroleum ether, hydrogenated petroleum fractions, limonene or other terpenes, toluene, isopropyl benzene etc., ketones such as, for example, methyl ethyl ketone, halogenated hydrocarbons such as chloroform, trichloroethane or tetrachloroethane, esters such as, for example, acetic esters, acetoacetic acid esters or mixtures of these solvents. Additives such as surfactants or alcohols are possible constituents. After being dried, the resulting printing forms can be post-exposed or post-treated chemically in any sequence to make a non-tacky printing surface.

The flexographic printing plates of the present invention have surprisingly been found to show an improved transparency and are expected to have good ozone resistance.

It will be appreciated that an important advantage of the flexographic printing plates of the present invention is, that they are transparent for visible and UV light, which enables a high quality sharpness in the subsequent flexographic printing plates.

EXAMPLES

The following examples are provided to illustrate the present invention. The examples are not intended to limit the scope of the present invention and they should not be so interpreted. Amounts are in weight parts or weight percentages unless otherwise indicated.

One controlled distribution block copolymer of the present invention, prepared according to the process disclosed in copending patent application Ser. No. 60/355,210 referenced above, was used in the examples. Polymer #25 is a selectively hydrogenated ABA block copolymers where the A blocks are polystyrene blocks and the B block prior to hydrogenation is a styrene butadiene controlled distribution block having terminal regions that are rich in butadiene units and a center region that was rich in styrene units. The various parameters are shown in Table 1 below. Step I MW is the molecular weight of the first A block, Step II MW is the molecular weight of the AB blocks and Step III MW is the molecular weight of the ABA blocks. The polymer was hydrogenated such that greater than about 95% of the diene double bonds have been reduced.

TABLE 1

Controlled Distribution Polymers

| Polymer Number | Step I MW(k) | Step II MW(k) | Step III MW(k) | % Styrene in Mid Block B | Styrene Blockiness | 1,2-BD (%) | PSC (%) |
|---|---|---|---|---|---|---|---|
| 25 | 9.1 | 89 | 97 | 25.7 | 0 | 36 | 39 | where "MW(k)" = molecular weight in thousands and "PSC(%)" = wt % of styrene in the final polymer. "Styrene Blockiness" is for just the B block.

where "MW(k)"=molecular weight in thousands and "PSC (%)"=wt % of styrene in the final polymer. "Styrene Blockiness" is for just the B block.

Comparative Example 1

In Comparative Example 1, an S-EB-S KRATON G hydrogenated block copolymer was blended with a KRATON D non-hydrogenated SIS linear sequential block copolymer. The S—I—S block copolymer had an overall styrene content of 18.7 weight percent and polystyrene end blocks of about 11,000 mol weight, with an overall molecular weight of about 120,000. The S-EB-S block copolymer was a selectively hydrogenated styrene-butadiene-styrene block copolymer having an overall styrene content of about 30 weight percent, polystyrene end blocks of 10,000 and an overall molecular weight of about 67,000.

As shown in Table 2, various amounts of S-I-S polymer were blended with varying amounts of S-EB-S polymer in compositions 1 to 5. In compositions 6 to 10, the blends also included hexane diol diacrylate (HDODA). As shown in Table 2, the blends are hazy, and in the presence of HDODA, they phase separate. Accordingly, the blends of S-I-S polymer and S-EB-S polymer are generally not acceptable for flexographic plates.

Example 1

In Example 1, Polymer #25, a selectively hydrogenated, controlled distribution block copolymer according to the present invention was used in place of the S-EB-S polymer. As shown in Table 3, the controlled distribution polymer is much more compatible with the S-I-S block copolymer. Blends are only slightly hazy and do not phase separate.

Example 2

In Example 2, the controlled distribution polymer was blended with a different unhydrogenated block copolymer. In this example the elastomeric mid block is an isoprene/butadiene random copolymer (i.e. the polymer is an S-I/B-S block copolymer). As shown in Table 4, phase stable blends can also be made using the S-I/B-S block copolymer, which blends are only slightly hazy. The S-I/B-S block copolymer has an overall styrene content of 18.8 weight percent, a ratio of isoprene to butadiene of 60:40, polystyrene end blocks having a molecular weight of about 11,000, and an overall molecular weight of about 120,000.

Example 3

In Example 3, the controlled distribution polymer was blended with an unhydrogenated styrene/butadiene block copolymer. The block copolymer was an asymmetric copolymer having SB arms and B arms. On average the block copolymer had 1.5 arms of butadiene homopolymer and 2 arms of a styrene-butadiene block copolymer. The butadiene arms had a molecular weight of about 40,000 and the styrene-butadiene arms had a molecular weight of 14,700 for the styrene block and 40,000 for the butadiene block. The overall polystyrene content was about 17.5 weight percent, and an overall molecular weight of about 170,000. The coupling efficiency was about 89%, and the coupling agent was glycidoxy-propyl trimethoxy silane. The 1,2-vinyl content of the butadiene was about 57 mol percent, and the overall structure was $(SB)_2Y(B)_{1.5}$. As shown in Table 5, the controlled distribution block copolymer is particularly compatible with the high vinyl content asymmetric styrene/butadiene block copolymer. Blends of the two polymers are clear, with or without HDODA.

Example 4

In Example 4 photo-reactive polymer blends were prepared using a blend of Polymer #25 and the S-I-S triblock copolymer of Comparative Example 1. A control photoreactive film was also prepared using the S-I-S copolymer as the sole block copolymer in the blend.

The photo-reactive blends were prepared by dissolving all the components in toluene (20 wt % solutions) and pouring the solutions into glass petri dishes. The solvent was slowly evaporated over a period of 21 days in the absence of light. ("phr" refers to parts per hundred rubber).

Blend A:
    100 phr (85 wt % S-I-S/15 wt % Polymer #25)
    10 phr hexane diol diacrylate
    10 phr Shellflex 371N naphthenic oil (Shell)
    4 phr Irgacure 651 photoinitiator (Ciba)

Blend B (control):
    100 phr S-I-S copolymer
    10 phr hexane diol diacrylate
    10 phr Shellflex 371N naphthenic oil
    4 phr Irgacure 651 photoinitiator The dried films were evaluated for miscibility by dynamic mechanical analysis as well as visible inspection for clarity. Tensile properties and durometer measurements (Shore A) were also evaluated to judge the amount of relative cure since cross-linking by a UV-induced free radical reaction will strengthen the film as well as increase the hardness. The UV Exposure in the two tests (one on Blend A and one on Blend B) were at an intensity of 1000 mj/square-cm for 15 minutes.

The results shown in Table 6 suggest that the blends of the controlled distribution block copolymer and the S-I-S triblock copolymer are indeed compatible since Blend A has only a single Tan Delta peak in the DMA and are photoreactive as revealed by the dramatic increase in tensile strength of the photo-reactive film caused by irradiation.

Moreover, and unexpectedly, the blend containing the controlled distribution block copolymer (Blend A) had almost twice the tensile strength of Blend B after irradiation, suggesting Blend A cured more extensively than Blend B.

TABLE 2

Compatibility of S-I-S Copolymer and S-EB-S Copolymer

| Composition, % w | 1 | 2 | 3 | 4 | 5 | 6 | 7 | 8 | 9 | 10 |
|---|---|---|---|---|---|---|---|---|---|---|
| S-I-S Copolymer | 100 | 75 | 50 | 25 | | 80 | 60 | 40 | 20 | |
| S-EB-S Copolymer | | 25 | 50 | 75 | 100 | | 20 | 40 | 60 | 80 |
| Hexane diol diacrylate | | | | | | 20 | 20 | 20 | 20 | 20 |
| Appearance of Dry Film | 1 | 2 | 3 | 4 | 5 | 6 | 7 | 8 | 9 | 10[b)] |
| Clarity | clear | hazy | hazy | hazy | clear | clear | a) | a) | a) | clear |
| Surface Quality | smooth | slight rough | very rough | rough | smooth | smooth | | | | smooth |
| Surface Gloss | high | dull | dull | fair | high | high | | | | high |
| Surface Tack | none | none | none | none | none | high | | | | none |

[a)] Film separated into two phases upon drying; one part was clear and tacky, the other slightly hazy and slightly tacky.
[b)] During drying, the film broke apart into pieces like a jig-saw puzzle.

TABLE 3

Compatibility of S-I-S Copolymer and CD Polymer # 25

| | 1 | 2 | 3 | 4 | 5 | 6 | 7 | 8 | 9 | 10 |
|---|---|---|---|---|---|---|---|---|---|---|
| Composition, % w | | | | | | | | | | |
| S-I-S Copolymer | 100 | 75 | 50 | 25 | | 80 | 60 | 40 | 20 | |
| CD Polymer # 25 | | 25 | 50 | 75 | 100 | | 20 | 40 | 60 | 80 |
| Hexane diol diacrylate | | | | | | 20 | 20 | 20 | 20 | 20 |
| Appearance of Dry Film | | | | | | | | | | |
| Clarity | clear | slight haze | slight haze | slight haze | clear | clear | slight haze | clear | slight haze | clear |
| Surface Quality | smooth | rough | very rough | smooth | smooth | smooth | rough | very rough | smooth | smooth |
| Surface Gloss | high | fair | fair | dull | high | high | fair | fair | dull | high |
| Surface Tack | none | none | none | none | none | slight | slight | slight | none | none |

TABLE 4

Compatibility of S-I/B-S Copolymer and CD Polymer # 25

| | 1 | 2 | 3 | 4 | 5 | 6 | 7 | 8 | 9 | 10 |
|---|---|---|---|---|---|---|---|---|---|---|
| Composition, % w | | | | | | | | | | |
| S-I/B-S Copolymer | 100 | 75 | 50 | 25 | | 80 | 60 | 40 | 20 | |
| CD Polymer # 25 | | 25 | 50 | 75 | 100 | | 20 | 40 | 60 | 80 |
| Hexane diol diacrylate | | | | | | 20 | 20 | 20 | 20 | 20 |
| Appearance of Dry Film | | | | | | | | | | |
| Clarity | clear | slight haze | slight haze | slight haze | clear | clear | slight haze | clear | slight haze | clear |
| Surface Quality | smooth | rough | very rough | smooth | smooth | smooth | rough | very rough | smooth | smooth |
| Surface Gloss | high | fair | fair | fair | high | frosted | fair | fair | fair | high |
| Surface Tack | none | none | none | none | none | slight | slight | slight | slight | none |

TABLE 5

Compatibility of (SB)Y(B) Copolymer and CD Polymer # 25

| | 1 | 2 | 3 | 4 | 5 | 6 | 7 | 8 | 9 | 10 |
|---|---|---|---|---|---|---|---|---|---|---|
| Composition, % w | | | | | | | | | | |
| (SB)Y(B) Copolymer | 100 | 75 | 50 | 25 | | 80 | 60 | 40 | 20 | |
| CD Polymer # 25 | | 25 | 50 | 75 | 100 | | 20 | 40 | 60 | 80 |
| Hexane diol diacrylate | | | | | | 20 | 20 | 20 | 20 | 20 |

TABLE 5-continued

Compatibility of (SB)Y(B) Copolymer and CD Polymer # 25

|  | 1 | 2 | 3 | 4 | 5 | 6 | 7 | 8 | 9 | 10 |
|---|---|---|---|---|---|---|---|---|---|---|
| Appearance of Dry Film | | | | | | | | | | |
| Clarity | clear | clear | clear | clear | clear | clear | clear | clear | clear | clear |
| Surface Quality | smooth | smooth | rough | slight rough | smooth | smooth | slight rough | rough | slight rough | smooth |
| Surface Gloss | high | high | fair | fair | high | high | high | fair | fair | high |
| Surface Tack | none | none | none | none | none | slight | slight | slight | slight | none |

TABLE 6

| Blend | UV Exposure | Tensile Strength psi | % Tensile Strength Increase | Shore A Hardness | Film Appearance | DMA Tan Delta (Rubber Phase) |
|---|---|---|---|---|---|---|
| A | none | 20 | — | 37. | slight haze | Single peak |
| A | yes | 970 | 4850 | 53 | slight haze | Single peak |
| B | — | 50 | 50 | — | 35 clear | Single peak |
| B | yes | 510 | 920 | 50. | clear | Single peak |

What is claimed:

1. A photopolymerizable composition, which comprises:
   a. a block copolymer component comprising a non-hydrogenated styrene/diene block copolymer, and a hydrogenated, controlled-distribution block copolymer, wherein said hydrogenated, controlled-distribution block copolymer has at least one polymer block A and at least one polymer block B, and wherein:
      i) prior to hydrogenation each A block is a mono alkenyl arene homopolymer block and each B block is a controlled distribution copolymer block of at least one conjugated diene and at least one mono alkenyl arene;
      ii) subsequent to hydrogenation about 0–10% of the arene double bonds have been reduced, and at least about 90% of the conjugated diene double bonds have been reduced;
      iii) each A block having a number average molecular weight between about 3,000 and about 60,000 and each B block having a number average molecular weight between about 20,000 and about 300,000;
      iv) each B block comprises terminal regions adjacent to the A blocks that are rich in conjugated diene units and one or more regions not adjacent to the A blocks that are rich in mono alkenyl arene units;
      v) the total amount of mono alkenyl arene in the hydrogenated block copolymer is about 20 percent weight to about 80 percent weight; and
      vi) the weight percent of mono alkenyl arene in each B block is between about 10 percent and about 75 percent;
      vii) the B block has a monoalkenyl arene blockiness index of less than about 40%;
   b one or more photopolymerizable ethylenically unsaturated low molecular weight compounds,
   c one or more polymerization initiators, and optionally
   d from 0 to 40% by weight, based on the total photopolymerizable composition, of one or more auxiliaries.

2. The photopolymerizable composition according to claim 1 wherein said mono alkenyl arene is styrene and said conjugated diene in said controlled distribution block copolymer is selected from the group consisting of isoprene and butadiene.

3. The photopolymerizable composition according to claim 2 wherein said conjugated diene is butadiene, and wherein about 20 to about 80 mol percent of the condensed butadiene units in block B have 1,2-configuration.

4. The photopolymerizable composition according to claim 3 wherein the styrene blockiness of the block B is less than about 40 percent.

5. The photopolymerizable composition according to claim 3 wherein the weight percent of styrene in each B block is between about 10 percent and about 30 percent, and the styrene blockiness index of each block B is less than about 10 percent, said styrene blockiness index being defined to be the proportion of styrene units in the block B having two styrene neighbors on the polymer chain.

6. The photopolymerizable composition according to claim 3 wherein said hydrogenated, controlled-distribution block copolymer is an ABA, $(A-B)_n$, $(A-B)_nA$, or $(A-B)_nX$ block copolymer where n is an integer from 2 to about 30, X is the coupling agent residue, said block copolymer having a total molecular weight of about 40,000 to about 140,000 and wherein each B block has between 10 and 30 weight percent styrene.

7. The photopolymerizable composition according to claim 3, wherein component (b) is selected from esters or amides of acrylic acid or methacrylic acid with monofunctional or polyfunctional alcohols, amines, aminoalcohols and hydroxyl ethers or hydroxyl esters.

8. The photopolymerizable composition according to claim 7, wherein component (b) is selected from butyl acrylate, isodecyl acrylate, trimethylolpropane triacrylate, hexane diol diacrylate and dipentaerythritol monohydroxypentacrylate.

9. The photopolymerizable composition of claim 8 wherein component (b) is hexane diol diacrylate.

10. The photopolymerizable composition of claim 3 wherein the weight ratio of controlled distribution block copolymer to unhydrogenated styrene/diene block copolymer is between about 5:95 to about 40:60.

11. The photopolymerizable composition of claim 10 wherein said unhydrogenated styrene/diene block copolymer is an CDC, $(C-D)_n$, $(C-D)_nC$, $(C-D)_nY(D)_m$ or $(C-D)_nY$ block copolymer where n is an integer from 2 to about 30, m is an integer from 1 to about 5, Y is the coupling agent residue, C is a styrene homopolymer block, and D is a polymer block of one or more conjugated dienes selected from butadiene and isoprene, said unhydrogenated block copolymer having a total molecular weight of about 40,000 to about 200,000.

12. The photopolymerizable composition according to claim 11 wherein said unhydrogenated block copolymer is a styrene-isoprene-styrene block copolymer.

13. The photopolymerizable composition according to claim 11 wherein said unhydrogenated block copolymer is a styrene-isoprene/butadiene-styrene block copolymer.

14. The photopolymerizable composition according to claim 11 wherein said unhydrogenated block copolymer is a radial styrene/butadiene block copolymer having the structure $(C-D)_nY$ or $(C-D)_nY(D)_m$ where the C block is a block of styrene polymer, the D block is a butadiene block, Y is the coupling agent residue, n is on average about 2 and m is on average about 1.5.

15. The photopolymerizable composition of claim 3 wherein said polymerization initiators are selected from the group consisting of methylbenzoin, benzoin acetate, benzophenone, benzyl dimethyl-ketal and ethyl anthraquinone/4,4-bis(dimethyl amino)benzo-phenone.

16. The photopolymerizable composition of claim 3 wherein said auxiliaries are selected from the group consisting of plasticizers, aromatic resins, compatible rubbers, fillers, dyes, pigments, antioxidants, antiozonates, and thermal polymerization inhibitors.

17. A flexographic printing plate derived from the photopolymerizable composition of claim 1.

18. A flexographic printing relief form prepared from the flexographic printing plate of claim 17.

19. A clear composition comprising:
  b. about 5 to about 75 weight percent of a hydrogenated controlled distribution block copolymer, and
  c. about 95 to about 25 weight percent of an unhydrogenated radial styrene butadiene block copolymer, wherein said controlled distribution block copolymer has at least one polymer block A and at least one polymer block B, and wherein:
    viii) prior to hydrogenation each A block is a mono alkenyl arene homopolymer block and each B block is a controlled distribution copolymer block of at least one conjugated diene and at least one mono alkenyl arene;
    ix) subsequent to hydrogenation about 0–10% of the arene double bonds have been reduced, and at least about 90% of the conjugated diene double bonds have been reduced;
    x) each A block having a number average molecular weight between about 3,000 and about 60,000 and each B block having a number average molecular weight between about 20,000 and about 300,000;
    xi) each B block comprises terminal regions adjacent to the A blocks that are rich in conjugated diene units and one or more regions not adjacent to the A blocks that are rich in mono alkenyl arene units;
    xii) the total amount of mono alkenyl arene in the hydrogenated block copolymer is about 20 percent weight to about 80 percent weight; and
    xiii) the weight percent of mono alkenyl arene in each B block is between about 10 percent and about 75 percent;
    xiv) the B block has a monoalkenyl axene blockiness index of less than about 40%;
  and the unhydrogenated radial block copolymer is a radial styrene/butadiene block copolymer having the structure $(C-D)_nY(D)_m$ where the C block is a polymer block of styrene, the D block is a polymer block of 1,3-butadiene having a 1,2-vinyl content of between about 5 mol percent and 80 mol percent, Y is the coupling agent residue, n is an integer from 2 to about 30 and m is an integer from 1 to about 10.

20. The composition according to claim 19 wherein said controlled distribution block copolymer is an ABA, $(A-B)_n$, $(A-B)_nA$, or $(A-B)_nX$ block copolymer where n is an integer from 2 to about 30, X is the coupling agent residue, and wherein said monoalkenyl arene is styrene and said conjugated diene is 1,3-butadiene.

* * * * *